US006753748B1

(12) United States Patent
Schlenga (10) Patent No.: US 6,753,748 B1
(45) Date of Patent: Jun. 22, 2004

(54) SUPERCONDUCTING HIGH-FIELD MAGNET COIL WITH SUPERCONDUCTING JOINTS

(75) Inventor: Klaus Schlenga, Eggenstein-L (DE)

(73) Assignee: Bruker Biospin GmbH, Rheinstetten (DE)

( * ) Notice: Subject to any disclaimer, the term of this patent is extended or adjusted under 35 U.S.C. 154(b) by 0 days.

(21) Appl. No.: 10/445,264

(22) Filed: May 27, 2003

(30) Foreign Application Priority Data

Jun. 10, 2002 (DE) .......................................... 102 25 531

(51) Int. Cl.[7] .................................................. H01F 6/00
(52) U.S. Cl. ...................... 335/216; 505/100; 505/220; 505/705; 505/879
(58) Field of Search ................................ 335/216, 299; 174/125.1; 505/100, 211, 220, 230, 704, 705, 879, 887

(56) References Cited

U.S. PATENT DOCUMENTS

| 5,319,333 A | | 6/1994 | Roth |
| 5,358,929 A | * | 10/1994 | Fujikami et al. ............ 505/100 |
| 5,689,223 A | | 11/1997 | Demarmels |
| 6,133,814 A | | 10/2000 | Okada |
| 6,194,226 B1 | * | 2/2001 | Sato et al. ...................... 438/2 |

FOREIGN PATENT DOCUMENTS

EP           0 167 128          8/1986

OTHER PUBLICATIONS

"Current Transport and Microstructural Develpment in BSCCO Tapes and Joints Fabricated by Groove Rolling", Supercond. Sci. Technol. 13 (2000) 187–194.

"Fabrication and Characterization of the Joining of Bi–Pb–Sr–Ca–Cu–O Superconductor Tape", Supercond. Sci. Technol. 13 (2000) 237–2343.

"Flux Distributions in Jointed $Bi_2Sr_2Ca_2Cu_3O_{10+\delta}$ Tapes", Supercond. Sci. Technol. 11 (1998) 573–576.

"Development of 3 T Class Bi–2212 Insert Coils for High Field NMR", IEEE Transactions on Applied Superconductivity, vol. 9, No. 2, Jun. 1999.

* cited by examiner

*Primary Examiner*—Ramon M. Barrera
(74) *Attorney, Agent, or Firm*—Paul Vincent (57) ABSTRACT

A superconducting high-field magnet coil (1; 27; 38) comprising at least one radially inner (2) and at least one radially outer coil section (3; 32; 33), wherein at least the radially inner coil section (2) is wound in a solenoid-shaped fashion with an HTS (high temperature superconductor) band conductor (14; 20; 36) and wherein at least one superconducting connection is provided between the radially inner coil section and the radially outer coil section is characterized in that the superconducting connection comprises a first superconducting joint (5; 39) between two HTS band conductors at which the HTS band conductor of the radially inner coil section is connected to at least one further HTS band conductor (6; 21, 22; 29; 40), flatly overlapping same, such that the two HTS band conductors mutually subtend an angle of between 30° and 150°, and with a second superconducting joint (7; 41) which is electrically connected in series with the first, and which is geometrically disposed in a region of considerably lower magnetic field strength to connect the further HTS band conductor to the conductor of the radially outer coil section in an electrically conducting fashion. This provides superconducting connection between a brittle HTS superconducting material and another superconducting material in a high-field magnet coil system in a manner that does not substantially limit the performance of the HTS material.

20 Claims, 7 Drawing Sheets

SUPERCONDUCTING HIGH-FIELD MAGNET COIL WITH SUPERCONDUCTING JOINTS

This application claims Paris Convention priority of DE 102 25 531.8 filed Jun. 10, 2002 the complete disclosure of which is hereby incorporated by reference.

BACKGROUND OF THE INVENTION

The invention concerns a superconducting high-field magnet coil with at least one radially inner and at least one radially outer coil section, wherein at least the radially inner coil section is wound in a solenoid-shaped fashion with an HTS (high temperature superconductor) band conductor, and wherein at least one superconducting connection is provided between the HTS band conductor of the radially inner coil section and the conductor of the radially outer coil section.

A magnet field coil of this type is disclosed in U.S. Pat. No. 5,319,333. A method of providing contact between two band-shaped superconductors is described by A. N. Iyer et al. in Supercond. Sci. Technol. 13 (2000), pages 187–194.

Nuclear magnetic resonance (NMR) measurements are used for structure analysis in solid-state physics and chemistry and also for imaging methods in medical diagnostics for measuring the spatial density distribution of certain atoms, e.g. protons.

To obtain high resolution in an NMR measurement, maximum magnetic field strengths with simultaneous high temporal stability and spatial homogeneity are desired. These magnetic fields are generated by superconducting magnet coil systems. An electric current of up to several hundred amperes flows in the superconductingly short-circuited magnet coils with minimum loss thereby generating temporally stable magnetic fields of a magnitude of several tesla.

Superconductivity occurs only below a maximum temperature (transition temperature $T_c$), maximum current density (critical current density $j_c$), and a maximum magnetic field strength (critical magnetic field $H_c$), which all depend on the material. The maximum value of each parameter thereby depends on the instantaneous magnitude of the two other parameters. When a critical value is exceeded, the material is transferred into the normally conducting state.

So-called high-temperature superconductors (HTS) have considerably larger $T_c$-, $j_c$- and $H_c$ values compared to typical metallic superconductors such as $Nb_3Sn$ or NbTi. For this reason, these materials are preferably used for inner coil sections of high-field magnet coils, which are subjected to the maximum magnetic field strengths.

However, the HTS materials have essentially no ductility and low breaking resistance. Therefore, the brittle, ceramic HTS materials must generally be produced in the geometrical shape of use. A band shape is particularly suitable, wherein the HTS material is embedded in a matrix, e.g. of silver. However, the band-shaped HTS can only be curved in the band direction (for example by flatly disposing the band-shaped superconductor on the peripheral surface of a wheel) and with a certain minimum radius. Strong bends (kinks) considerably reduce the current carrying capacity of the band-shaped HTS.

Production of complicated conductor configurations therefore requires that the HTS materials conductingly contact a ductile metallic superconductor Superconducting High-Field Magnet Coil with Superconducting Joints such as e.g. NbTi. Since these materials have relatively small $H_c$ values, they are preferably used in the outer region of coil configurations.

Contact between two superconducting partial sections of a conductor configuration is basically problematic. Solder having a smaller $H_c$ than the remaining superconducting material is usually used to produce a superconducting electric contact. The solder limits applications for the superconductor configuration. Alternatively, the joint must be provided in a region of reduced magnetic field strength. At least the spatial configuration of the materials used in the magnetic field limits the applications of the overall superconductor configuration.

The situation is particularly problematic with HTS materials: Due to the mechanical properties, guiding of the joints out of the high-field region of a radially inner HTS coil section is nearly impossible, and limitation of the magnetic field strength due to solder or to a ductile metallic superconducting material would render use of HTS materials pointless. For these reasons, the full potential of HTS materials in temporally highly stable and highly homogeneous NMR magnets has not been realized up to this point in time.

To produce joints between two band-shaped BSCCO superconductors, according to Iyer et al., loc. cit., the matrix material (typically silver) is etched away on one side of each of the band-shaped superconductors being connected, and the exposed superconductor surfaces are pressed together and aged at a high temperature (lap joint). Alternatively, the front ends of exposed superconductor surfaces abut and are then thermo-mechanically treated (butt joint). In both technologies, the travel of the band direction is continued. No solder is used in either type of joints; however, in the region of the joints, $j_c$ is reduced to approximately one third of $j_c$ in the band-shaped superconductor. Similar joints are disclosed in U.S. Pat. No. 6,133,814.

To be able to utilize the full potential of HTS materials in superconducting magnet coil systems, the inner coil sections, which are formed from HTS materials, must be superconductingly joined to the outer coil sections consisting of ductile metallic superconducting material without having the contact points or the metallic superconducting material substantially limit the performance of the magnet coil system.

It is therefore the object of the present invention to propose a superconducting connection between a brittle HTS superconducting material and another superconducting material, in particular a metallic superconductor, in a high-field magnet coil system which does not considerably limit use of the magnet coil system and, in particular, the performance of the HTS material.

SUMMARY OF THE INVENTION

This object is achieved in a surprisingly simple but effective fashion by a superconducting magnet field coil of the above-mentioned type which is characterized in that the superconducting connection comprises a first superconducting joint between two HTS band conductors where the HTS band conductor of the radially inner coil section is connected in a flat, overlapping fashion with at least one further HTS band conductor such that the two HTS band conductors mutually subtend an angle of between 30° and 150°, preferably approximately 90°, and a second superconducting joint is provided which is electrically connected in series with the first superconducting joint and is disposed geometrically in a region of a considerably smaller magnetic field strength to connect the further HTS band conductor to the conductor of the radially outer coil section, in an electrically conducting fashion.

The direct transition between the HTS band conductor of the inner coil section and a conductor of the outer coil section is replaced by a first high-field-compatible transition between the HTS band conductor of the inner coil section and a further HTS band conductor, which involves a change in direction and is therefore suited to guide a superconducting material path out of the high-field region, and a second transition from the further HTS band conductor to the conductor of the outer coil section, provided in a low field region. The invention provides at least two joints instead of one joint, to utilize the potential of the HTS material of the inner coil section, in particular the high $H_c$ value.

The high-field region has only one transition from HTS to HTS (first joint) whereas the transition from HTS to the conductor of the outer coil section (second joint) is disposed in a region of reduced magnetic field strength, as is the overall conductor material of the outer coil section. The HTS-HTS contact can be fundamentally produced with high $H_c$ and $j_c$, values and the inventive geometry of the first joint permits the required removal of the second joint out of the high-field region.

U.S. Pat. No. 6,133,814, column 5, line 35 to column 8, line 26, mentions selected HTS materials, which can be used in an inventive high-field magnet coil.

A particularly preferred embodiment of the superconducting high-field magnet coil is characterized in that the HTS band conductor of the radially inner coil section and the further HTS band conductor, which are connected at the first superconducting joint, are made from the same HTS material. Disadvantageous selection of different HTS materials at the first superconducting joint could lead to an excessive reduction in $j_c$ and/or $H_c$ in this region. This risk is largely minimized by using the same HTS materials in the band conductor of the radially inner coil section and in the further HTS band conductor. In this manner, the characteristics of only one material must be taken into consideration for the manufacture and tailoring of the properties of the first superconducting joint.

In another, particularly preferred embodiment, the further HTS band conductor and the conductor of the radially outer coil section, which are connected in an electrically conducting fashion at the second superconducting joint, are made from different superconducting materials. In particular, the conductor of the radially outer coil section contains metallic superconductors, preferably $Nb_3Sn$ or NbTi. This embodiment utilizes the advantages of the invention, since NbTi has good ductility (and is thereby easy to handle) and is used as a standard in the low field region of magnet coil systems, in particular for electric contact with external current sources.

One embodiment of the inventive superconducting high-field magnet coil is preferred with which the superconducting high-field magnet coil is superconductingly short-circuited during operation. This is the standard configuration in NMR operation and exhibits high temporal stability for the magnet field generated by the inventive high-field magnet coil.

In another embodiment, the radially outer coil section projects past the radially inner coil section in an axial direction. This configuration generates a magnetic field with good homogeneity and also corresponds to the standard geometry of magnet coil systems. For this geometry, no previous solution to the object of the present invention had been found.

In a further preferred embodiment, the HTS band conductor of the radially inner coil section is connected to a plurality of substantially parallel further HTS band conductors at the first superconducting joint. The increased number of contact locations increases the surface contact between the two HTS band conductors and thereby the absolute current carrying capacity of the superconducting joints.

In one additional preferred embodiment of the superconducting high-field magnet coil, the HTS band conductor of the radially inner coil section is connected on two opposite sides to further HTS band conductors in a flat overlapping fashion at the first superconducting joint. This increases both the mechanical stability of the contact as well as the contact surface between the two HTS band conductors and therefore the absolute current carrying capacity of the first superconducting joint.

In another preferred embodiment, the angle between the HTS band conductor of the radially inner coil section and the further HTS band conductor is selected such that the further HTS band conductor is guided along the axially outer edges of radially further outward coil sections which axially project past the inner coil section. This configuration saves space and permits compact construction of the high-field magnet coil.

In another embodiment of the inventive superconducting high-field magnet coil, the radially inner coil section is wound on a winding body having end flanges and the first superconducting joint is disposed in a recess of an end flange. This limits the radial extension of the magnet coil system to the inner or outer coil radius and the first superconducting joint does not project into the region of the bore or the region of radially further outward coil sections.

The present invention also concerns a superconducting joint between two HTS band conductors for use in a superconducting high-field magnet coil of the above-described type, with which the two HTS band conductors subtend an angle of between 30° and 150°, preferably approximately 90°, at the superconducting joint.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is shown in the drawing and is explained in more detail with reference to embodiments.

DESCRIPTION OF THE PREFERRED EMBODIMENT

All figures schematically show embodiments of the invention.

Figure 1:
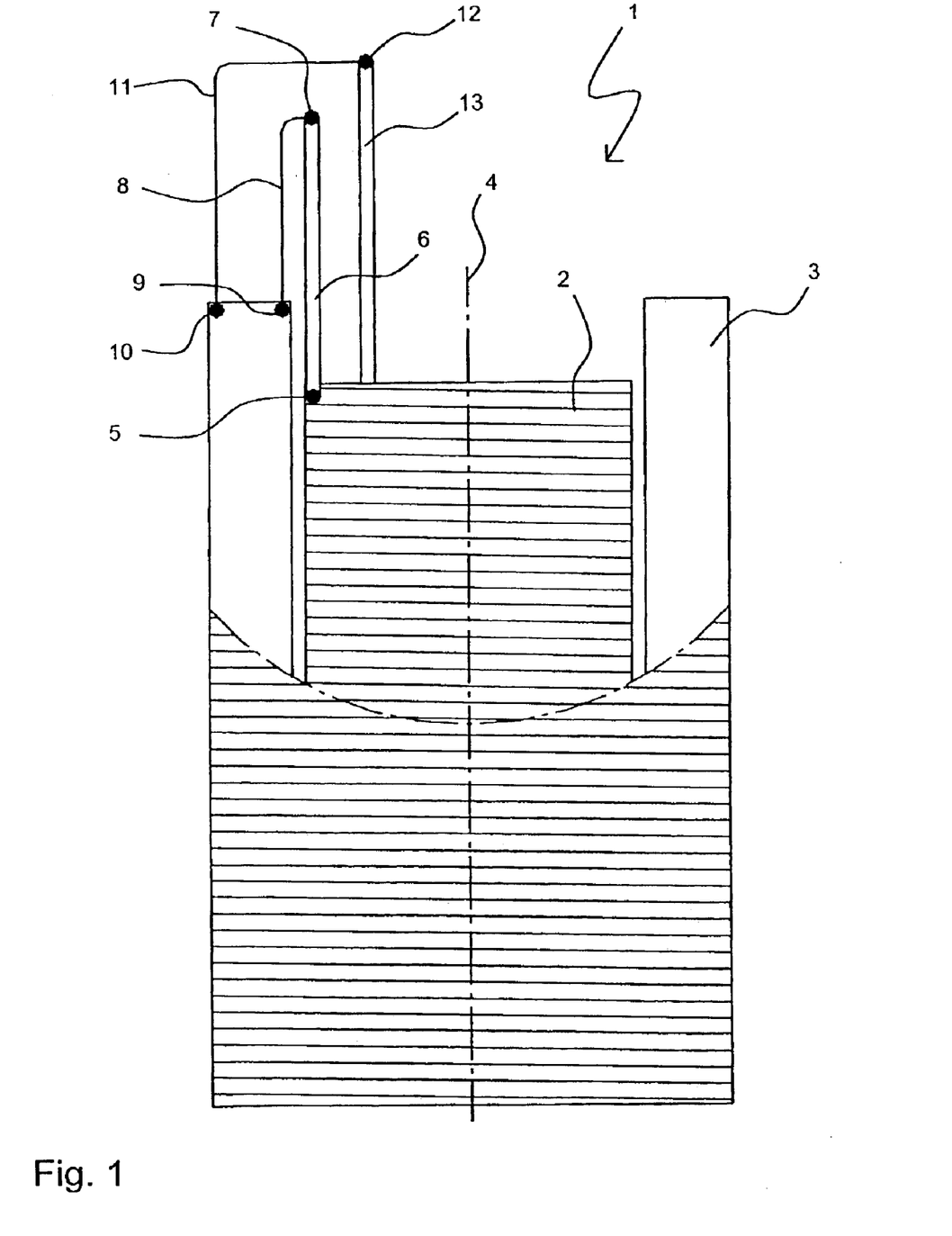
FIG. 1 shows an inventive high-field magnet coil.

FIG. 1 shows an inventive high-field magnet coil 1. The high-field magnet coil 1 has a radially inner coil section 2 and a radially outer coil section 3 which are each disposed coaxially about an axis 4. Both coil sections 2, 3 are wound from band-shaped superconductors, wherein the superconducting material of the inner coil section 2 is an HTS material. At a first superconducting joint 5, a further HTS band conductor 6 contacts the HTS band conductor of the inner coil section 2, with the two band conductors subtending an angle of approximately 90°. The HTS band conductor 6 extends approximately parallel to the axis 4. The two HTS band conductors are preferably made from the same material. The further HTS band conductor 6 prominently projects past the outer coil section 3 such that the upper end of the further HTS band conductor 6 is disposed in a region of low magnetic field strength, compared to the region of the inner coil section 2. A second superconducting joint 7 is provided at this upper end with the further HTS band conductor 6 contacting a first superconducting section 8. The second superconducting joint 7 is therefore in a low field region to permit use of conventional joint technologies, in particular, soldering joints. The superconducting section 8 is made from a ductile metallic superconductor, such as NbTi, and can be easily guided to the third superconducting joint 9 at which the band conductor of the outer coil section 3 is contacted. Since the overall outer coil section 3 is exposed to a smaller magnetic field strength than the inner coil section 2, the same metallic superconductor can be used. The outer coil section 3 is connected to a third HTS band conductor 13 via a fourth superconducting joint 10 and a second superconducting section 11 at a fifth superconducting joint 12 to produce electric contact with the inner coil section 2 via a further inventive superconducting joint, thereby superconductingly short-circuiting the outer coil section 3 to the inner coil section 2.

Figure 2:
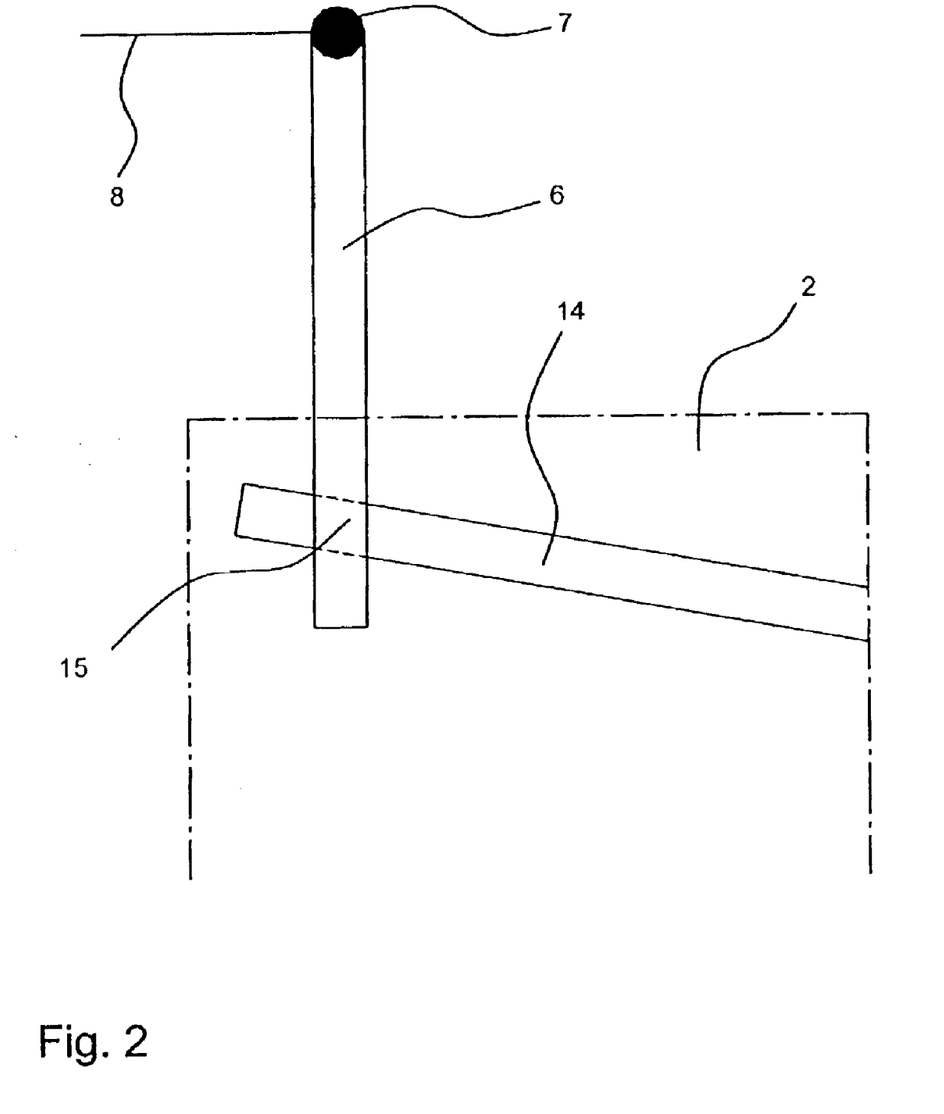
FIG. 2 shows an inventive contact of an inner coil section of a high-field magnet coil.

FIG. 2 shows a detail of the contact to the further HTS band conductor 6 of FIG. 1. The HTS band conductor 14 of the inner coil section 2 overlaps the further HTS band conductor 6 in an overlapping region 15. The two HTS band conductors subtend an angle of approximately 90–100°. A high current carrying capacity is obtained in accordance with the invention despite the prevailing high magnetic field strength in the overlapping region 15 due to the use of identical HTS materials in the two HTS band conductors 6, 14 that are in direct mutual contact in the region 15.

Figure 3:
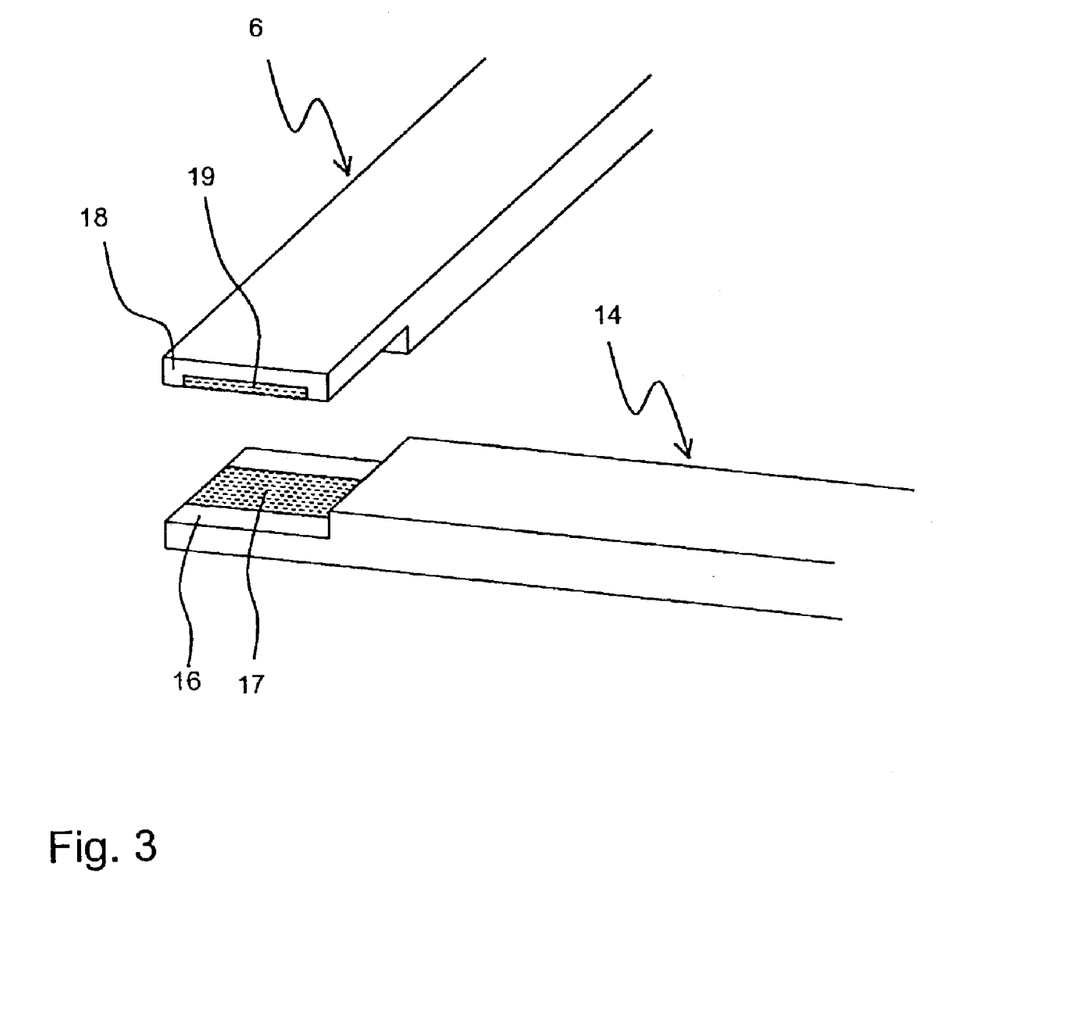
FIG. 3 shows an embodiment of an inventive joint between two HTS band conductors, with contact on one side.

FIG. 3 shows a possible inventive embodiment of the overlapping region 15. The envelope material (matrix material) 16, typically silver, is partially etched away at the left end of the HTS band conductor 14 of the inner coil section 2 to expose HTS material 17. Part of the envelope material 18 of the further HTS band conductor 6 has been etched away to also expose HTS material 19 at that location. To produce an electric contact between the two band conductors 6, 14, the two exposed surfaces of the HTS materials 17, 19 are overlaid and pressed together.

Figure 4:
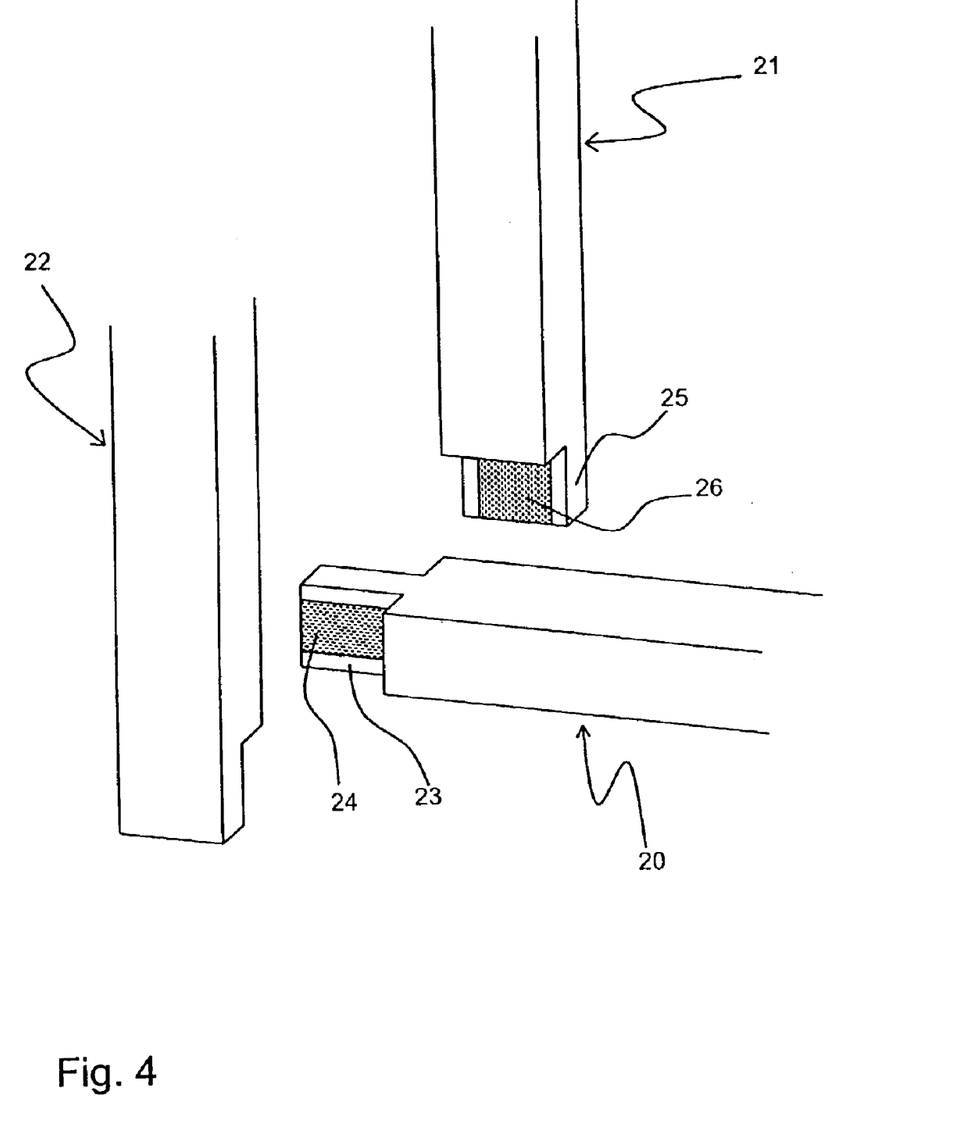
FIG. 4 shows an embodiment of an inventive joint between HTS band conductors, with contacts on two sides.

Connections at both sides can provide improved contact (see FIG. 4). One end of an HTS band conductor 20, which belongs e.g. to the inner coil section 2, is etched away at the upper and lower band surface (in the figure, at the front and rear of the HTS band conductor 20) to produce recessed surfaces having both envelope material 23 and HTS material 24. Further HTS band conductors 21, 22 were also etched at their lower ends of FIG. 4 such that only little envelope material 25 but sufficient HTS material 26 is exposed. The exposed surfaces of the HTS band conductor 20 and the HTS band conductors 21, 22 are pressed together for contacting, wherein the region of the HTS band conductor 20, etched away on both sides, is disposed like a sandwich between the etched regions of the HTS band conductors 21, 22 which have been etched on one side.

Figure 5:
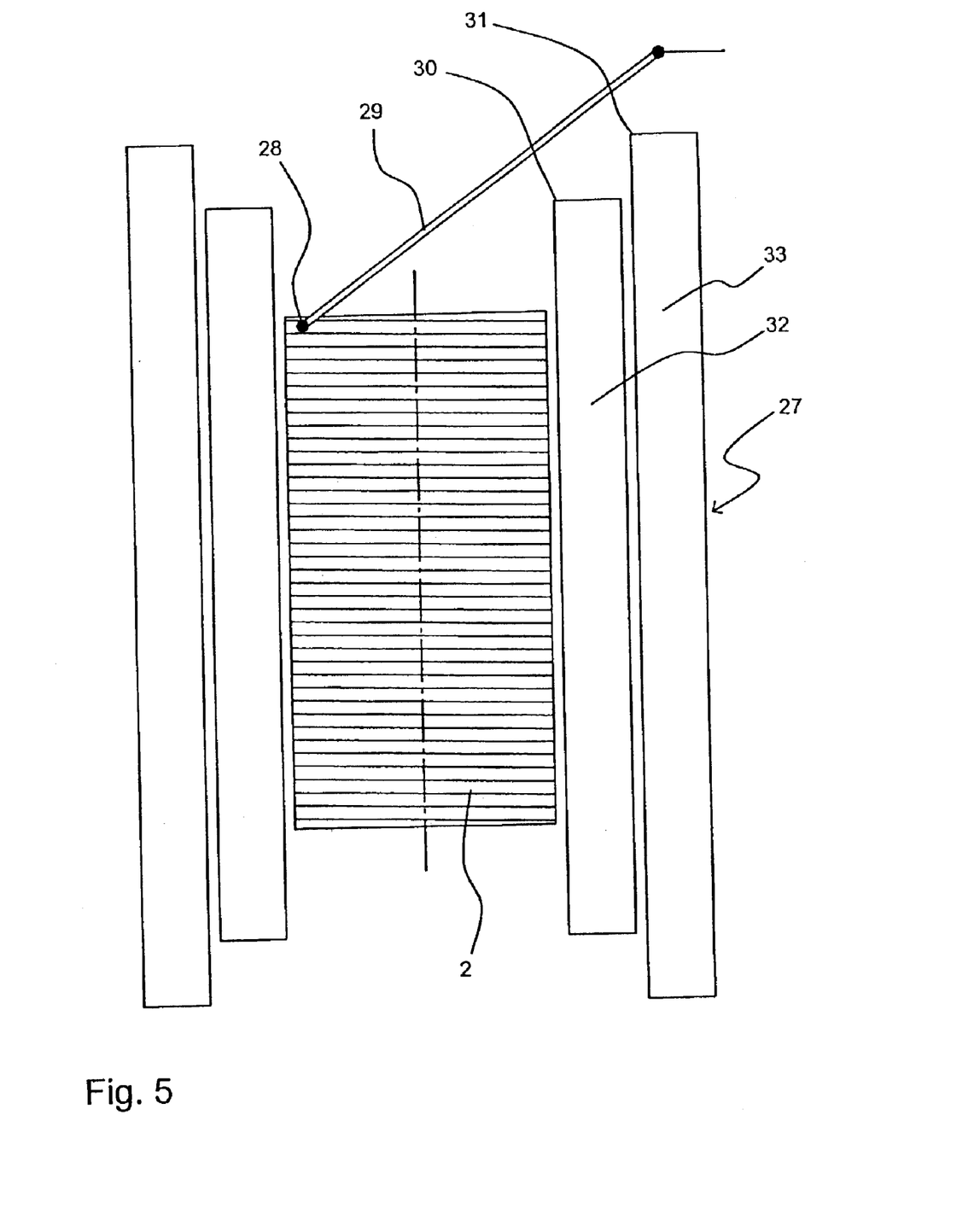
FIG. 5 shows an embodiment of an inventive high field magnet coil wherein a band conductor is guided close to the edges.

FIG. 5 shows a further embodiment of an inventive high-field magnet coil 27. The HTS band conductor of the inner coil section 2 contacts a further HTS band conductor 29 at an inventive superconducting transition 28. The further HTS band conductor 29 is guided at an angle out of the inside of the high-field magnet coil system 27, approximately along the edges 30, 31 of the radially outer coil sections 32, 33. This guidance of the further HTS band conductor 29 provides for a space-saving construction of the high-field magnet coil 27.

Figure 6:
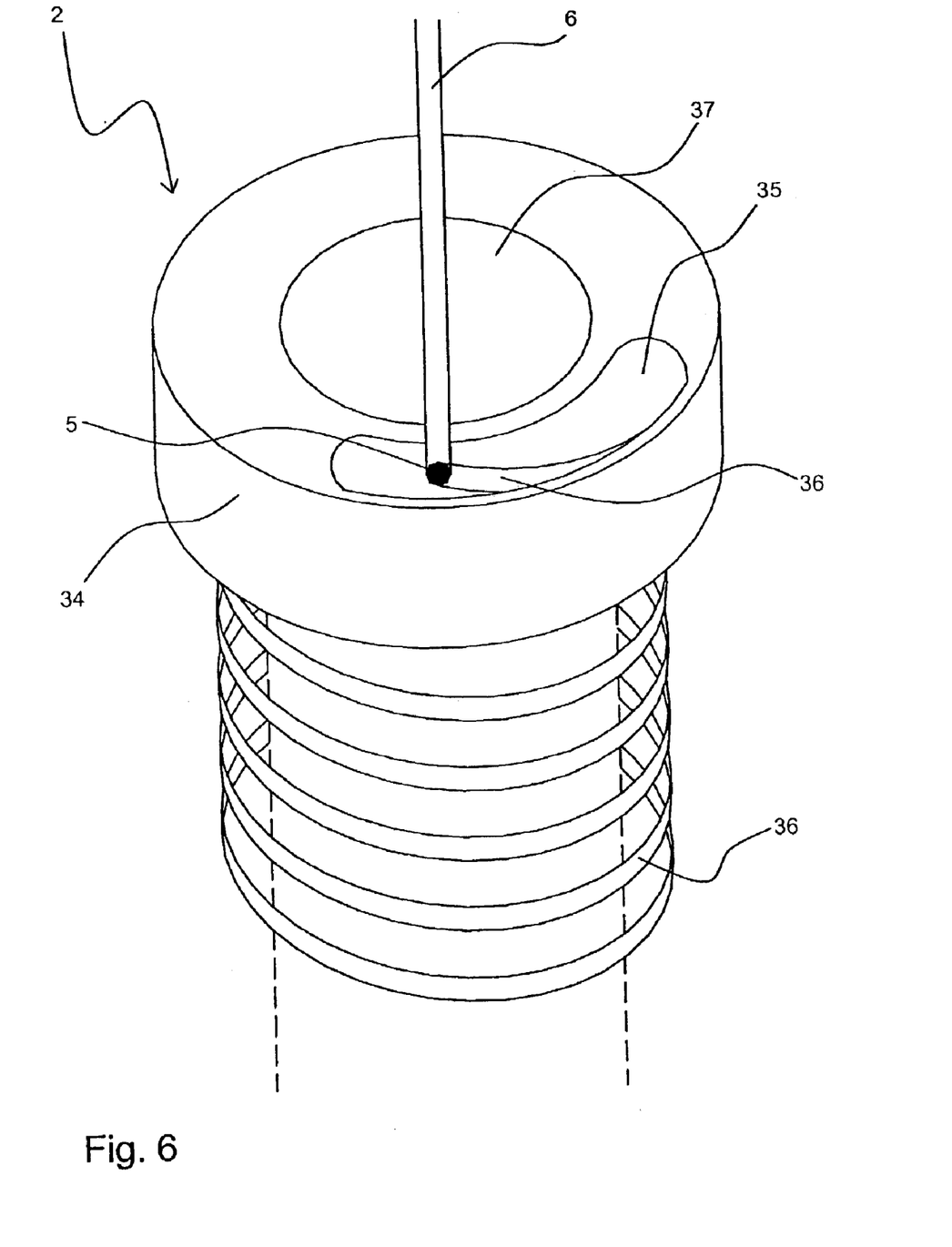
FIG. 6 shows an inner coil section of an embodiment of an inventive high-field magnet coil with an end flange.

FIG. 6 shows an embodiment of an inner coil section 2 of an inventive high-field magnet coil. The upper end of the inner coil section 2 has a flange 34 with an opening 35. The HTS band conductor 36 of the inner coil section 2 terminates in this opening at a first superconducting joint 5 which connects the HTS band conductor 36 of the inner coil section 2 to the further band-shaped superconductor 6 used to provide a superconducting electric connection in a region of low magnetic field strength. This construction keeps the bore 37 and the radial outer region of the inner coil section 2 free from further HTS band conductors 6 to obtain a more compact construction and better access to the working volume inside of the bore 37.

Figure 7:
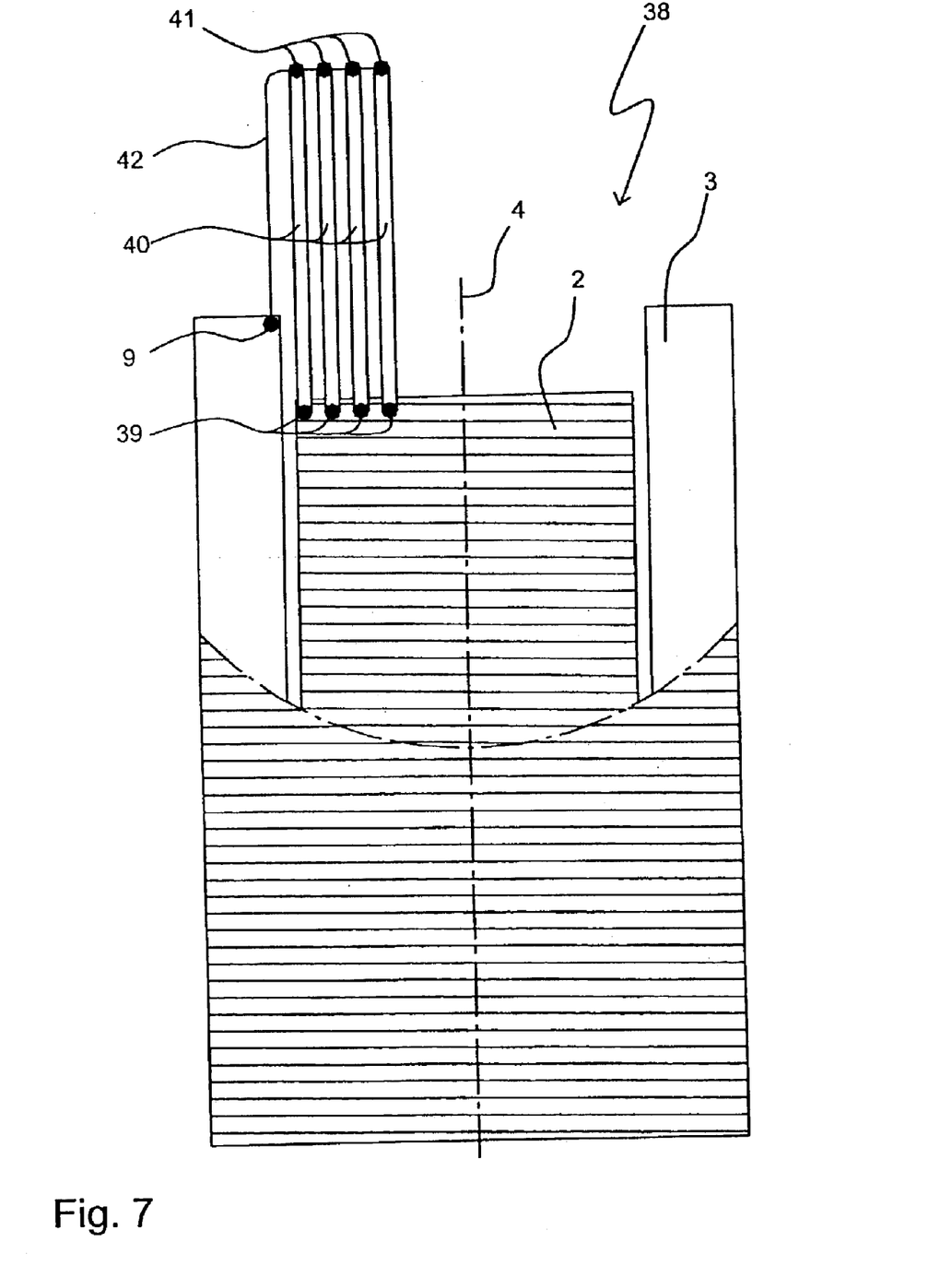
FIG. 7 shows an embodiment of an inventive high-field magnet coil with four contacting band conductors.

FIG. 7 shows another embodiment of an inventive high-field magnet coil 38. The HTS band conductor of the inner coil section 2 is contacted at four superconducting joints 39 by four further HTS band conductors 40. They extend approximately parallel to the axis 4 and terminate in four further superconducting joints 41 which are connected to the outer coil section 3 via the superconducting transition piece 42 and the third superconducting joint 9. The plurality of further parallel HTS band conductors 40 increases the current carrying capacity and reliability of the high-field magnet coil 38.

I claim:

1. A superconducting high-field magnet coil, the coil comprising:
   at least one radially inner coil section wound in a solenoidal manner with a first band of HTS (high temperature superconductor) conductor material;
   at least one second band of HTS conductor disposed to flatly overlap said first band at a first superconducting joint location, said first and said second bands mutually subtending an angle of between 30° and 150°;
   a radially outer coil section; and
   means for electrically connecting said radially outer coil section to said second band at a second superconducting joint in electrical series with said first joint, said second joint disposed in a region of substantially lower magnetic field strength.

2. The superconducting high-field magnet coil of claim 1, wherein said angle is approximately 90°.

3. The superconducting high-field magnet coil of claim 1, wherein said first HTS band conductor of said radially inner coil section and said second HTS band conductor connected at said first superconducting joint are made from a same HTS material.

4. The superconducting high-field magnet of claim 1, wherein said second HTS band conductor and conductor of said radially outer coil section, which are connected at said second superconducting joint in an electrically conducting fashion, are made from different superconducting materials.

5. The superconducting high-field magnet of claim 4, wherein said conductor of said radially outer coil section contains a metallic superconductor.

6. The superconducting high-field magnet of claim 5, wherein said metallic superconductor is one of $Nb_3Sn$ and NbTi.

7. The superconducting high-field magnet of claim 1, wherein the superconducting high-field magnet coil is superconductingly short-circuited during operation.

8. The superconducting high-field magnet coil of claim 1, wherein said radially outer coil section projects past said radially inner coil section in an axial direction.

9. The superconducting high-field magnet coil of claim 1, wherein said first HTS band conductor of said radially inner coil section is connected to a plurality of substantially parallel second HTS band conductors at the said first superconducting joint location.

10. The superconducting high-field magnet of claim 1, wherein said first HTS band conductor of said radially inner coil section is connected on two opposite sides to two of said second HTS band conductors in a flat, overlapping fashion at said first superconducting joint location.

11. The superconducting high-field magnet coil of claim 1, wherein said angle between said first HTS band conductor of said radially inner coil section and said second HTS band conductor is selected such that said second HTS band conductor is guided along axially outer edges of said radially further outward coil section which axially project past said inner coil section.

12. The superconducting high-field magnet coil of claim 1, wherein said radially inner coil section is wound on a winding body having end flanges and said first superconducting joint is disposed in an opening in one of said end flanges.

13. The superconducting high-field magnet coil of claim 1, wherein said angle is approximately 90°, wherein said first HTS band conductor of said radially inner coil section and said second HTS band conductor connected at said first superconducting joint are made from a same HTS material.

14. The superconducting high-field magnet coil of claim 13, wherein said second HTS band conductor and conductor of said radially outer coil section, which are connected at said second superconducting joint in an electrically conducting fashion, are made from different superconducting materials.

15. The superconducting high-field magnet coil of claim 1, wherein said angle is approximately 90°, wherein the superconducting high-field magnet coil is superconductingly short-circuited during operation.

16. The superconducting high-field magnet coil of claim 1, wherein said first HTS band conductor of said radially inner coil section and said second HTS band conductor connected at said first superconducting joint are made from a same HTS material, wherein the superconducting high-field magnet coil is superconductingly short-circuited during operation.

17. The superconducting high-field magnet of claim 1, wherein said second HTS band conductor and conductor of said radially outer coil section, which are connected at said second superconducting joint in an electrically conducting fashion, are made from different superconducting materials, wherein the superconducting high-field magnet coil is superconductingly short-circuited during operation.

18. The superconducting high-field magnet of claim 1, wherein said second HTS band conductor and conductor of said radially outer coil section, which are connected at said second superconducting joint in an electrically conducting fashion, are made from different superconducting materials, wherein said conductor of said radially outer coil section contains a metallic superconductor, wherein the superconducting high-field magnet coil is superconductingly short-circuited during operation.

19. The superconducting high-field magnet of claim 1, wherein said second HTS band conductor and conductor of said radially outer coil section, which are connected at said second superconducting joint in an electrically conducting fashion, are made from different superconducting materials, wherein said conductor of said radially outer coil section contains a metallic superconductor, wherein said metallic superconductor is one of $Nb_3Sn$ and NbTi, wherein the superconducting high-field magnet coil is superconductingly short-circuited during operation.

20. The superconducting high-field magnet of claim 1, wherein the superconducting high-field magnet coil is superconductingly short-circuited during operation, wherein said radially inner coil section is wound on a winding body having end flanges and said first superconducting joint is disposed in an opening in one of said end flanges.

* * * * *